(12) United States Patent
Harwalkar et al.

(10) Patent No.: US 9,154,084 B2
(45) Date of Patent: Oct. 6, 2015

(54) LOW-NOISE RECEIVER WITH COMPLEX RF ATTENUATOR

(71) Applicant: Silicon Laboratories Inc., Austin, TX (US)

(72) Inventors: Navin Harwalkar, Austin, TX (US); Dan B. Kasha, Seattle, WA (US)

(73) Assignee: Silicon Laboratories Inc., Austin, TX (US)

( * ) Notice: Subject to any disclaimer, the term of this patent is extended or adjusted under 35 U.S.C. 154(b) by 109 days.

(21) Appl. No.: 13/953,803

(22) Filed: Jul. 30, 2013

(65) Prior Publication Data

US 2015/0035595 A1 Feb. 5, 2015

(51) Int. Cl.
*H04B 1/06* (2006.01)
*H03F 1/22* (2006.01)
*H03F 1/56* (2006.01)
*H03F 3/193* (2006.01)
*H04B 1/18* (2006.01)
*H04B 1/26* (2006.01)

(52) U.S. Cl.
CPC ............. *H03F 1/223* (2013.01); *H03F 1/565* (2013.01); *H03F 3/193* (2013.01); *H04B 1/18* (2013.01); *H03F 2200/213* (2013.01); *H03F 2200/225* (2013.01); *H03F 2200/294* (2013.01)

(58) Field of Classification Search
CPC ................................. H03G 1/04; H03G 3/3063
USPC .................................. 455/148.1, 249.1, 248.1
See application file for complete search history.

(56) References Cited

U.S. PATENT DOCUMENTS

| 8,818,309 B2 * | 8/2014 | Li et al. .................... 455/192.1 |
| 2003/0071697 A1 * | 4/2003 | Souetinov et al. .......... 333/81 R |
| 2007/0182424 A1 * | 8/2007 | Benedikt et al. .............. 324/637 |

FOREIGN PATENT DOCUMENTS

GB 2368736 * 5/2002 ............... H03H 7/24

* cited by examiner

*Primary Examiner* — Lee Nguyen
(74) *Attorney, Agent, or Firm* — Abel Law Group, LLP

(57) ABSTRACT

An apparatus includes an integrated circuit. The integrated circuit includes a low-noise amplifier having a first complex input impedance. The integrated circuit includes a complex attenuator coupled to an input terminal of the integrated circuit. The complex attenuator has a second complex input impedance and a first complex output impedance. The apparatus may include a matching network coupled to the input terminal of the integrated circuit. The matching network is external to the integrated circuit. The matching network may have a first real input impedance and a second complex output impedance. The second complex output impedance is matched to the second complex input impedance.

22 Claims, 6 Drawing Sheets

LOW-NOISE RECEIVER WITH COMPLEX RF ATTENUATOR

BACKGROUND

1. Field of the Invention

This application relates to integrated circuits, in general, and more particularly to radio frequency circuits included on integrated circuits.

2. Description of the Related Art

A typical radio frequency (RF) receiver handles large blocking signals, i.e., signals other than a target received signal that may be spectrally near the target received signal, by including an attenuator in the received signal path prior to a low-noise amplifier. The low-noise amplifier is typically the first gain stage in the receiver and is used to amplify possibly very weak received signals (e.g., RF signals captured by an antenna). Use of a low-noise amplifier reduces the effect of noise from subsequent stages of the receiver, while noise of the low-noise amplifier itself is injected directly into the received signal and dominates the input-referred noise of a receiver front end. Thus, the low-noise amplifier should apply gain to achieve a target signal power level while adding as little noise and distortion as possible so that recovery of the received signal is possible in later stages of the system. Design parameters for low-noise amplifiers include gain, noise figure, non-linearity, and impedance matching at the input and/or output ports. Input and output impedance matching circuits may provide efficient power transfer, improve noise performance, and improve stability of the low-noise amplifier. A target attenuator-low-noise amplifier architecture requires a constant input-port reflection coefficient, i.e., a constant S11. In general, S11 is a two-port scattering parameter that is used to measure and quantify reflection at the input port of an RF receiver.

As referred to herein, a complex impedance is an electrical impedance represented by a complex quantity $Z=R\pm jX$, where R is the resistance of the complex impedance and X is the reactance of the complex impedance. A complex impedance has a magnitude, which represents the ratio of the voltage at a node to the current through the node, and a phase, which represents a phase difference between voltage at the node and current through the node. The impedance of an ideal resistor is a purely real, resistive impedance where $Z=R$. The phase relationship between voltage and current is exactly zero degrees. Ideal inductors and capacitors have purely imaginary, reactive impedances where $Z=j\omega L$ and $$Z = \frac{1}{j\omega C},$$

respectively. In both cases, for an applied sinusoidal voltage, the resulting current is also sinusoidal, but 90 degrees out of phase with the voltage. However, for an inductor, the current is lagging and for the capacitor, the current is leading.

Referring to FIG. 1, a conventional RF receiver includes attenuator 104 coupled to the input of low-noise amplifier 106. The input impedance and the output impedance of attenuator 104 are real impedances (i.e., $Z_{INATT}=R+j0$, e.g., $Z_{INATT}=50$ ohms, and $Z_{OUTATT}=R+j0$, e.g., $Z_{OUTATT}=50$ ohms) and the input impedance of low-noise amplifier 106 is also a real impedance (i.e., $Z_{INLNA}=R+j0$, e.g., $Z_{INLNA}=50$ ohms). Design of 50-ohm attenuators (i.e., attenuators having input and output impedances that are both approximately 50 ohms) is well understood and widely known. However, a 50-ohm attenuator will only perform as expected if the input impedance of the low-noise amplifier (i.e., $Z_{INLNA}$) is approximately 50 ohms. A typical 50-ohm input impedance low-noise amplifier is a common-gate low-noise amplifier, or some variant thereof, or a feedback type low-noise amplifier. However, neither of those topologies achieves the low noise and low power performance of a complex-input-impedance low-noise amplifier, e.g., an inductively degenerated low-noise amplifier. In general, 50-ohm attenuators will not achieve target performance when used with a complex-input-impedance low-noise amplifier. Thus, typical complex-input-impedance low-noise amplifiers are not preceded by an attenuator and have poor large blocker handling characteristics. Accordingly, improved techniques for receivers are desired.

SUMMARY OF EMBODIMENTS OF THE INVENTION

In at least one embodiment of the invention, an apparatus includes an integrated circuit. The integrated circuit includes a low-noise amplifier having a first complex input impedance. The integrated circuit includes a complex attenuator coupled to an input terminal of the integrated circuit. The complex attenuator has a second complex input impedance and a first complex output impedance. The apparatus may include a matching network coupled to the input terminal of the integrated circuit. The matching network is external to the integrated circuit. The matching network may have a first real input impedance and a second complex output impedance. The second complex output impedance is matched to the second complex input impedance. The complex attenuator may include a selectable series impedance circuit having a first selectable impedance coupled between the input terminal of the integrated circuit and an input of the low-noise amplifier. The complex attenuator may include a first shunt circuit having a second selectable impedance. The first shunt circuit may be coupled between the input terminal of the integrated circuit and a first reference node. The complex attenuator may include a second shunt impedance circuit having a third selectable impedance coupled between the input of the low-noise amplifier and the first reference node.

In at least one embodiment of the invention, a method includes receiving a radio frequency signal by an attenuator presenting a complex impedance at an input terminal of an integrated circuit. The method includes providing an attenuated received signal to an amplifier. The attenuated received signal is generated by the attenuator. The attenuator is configured to maintain a complex input impedance at an input terminal of the integrated circuit. The method may include generating the attenuated received signal by applying a predetermined attenuation to the received signal. The predetermined attenuation may be a capacitive attenuation. The predetermined attenuation may be an inductive attenuation. The method may include changing an attenuation of the attenuator while maintaining the complex input impedance at the input terminal of the integrated circuit. The input port reflection coefficient of the attenuator may be constant. Changing the attenuation may include adjusting a series capacitance and a shunt capacitance to maintain a constant, complex impedance at the input terminal of the integrated circuit. The method may include extending a range of the attenuation using an additional shunt capacitance.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 2:
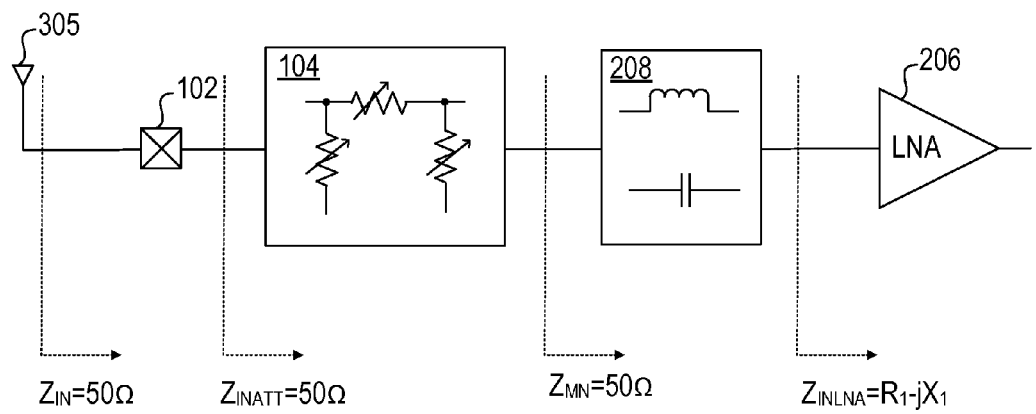
FIG. 2 illustrates an integrated circuit receiver including a real attenuator, a complex low-noise amplifier, and an on-chip matching network.

Referring to FIG. 2, an exemplary integrated circuit RF receiver is coupled to antenna 305 at integrated circuit terminal 102. The antenna has a real impedance (e.g., 50 ohm impedance). Attenuator 104 (e.g., a resistive pi-network) has a real input impedance matched to the antenna impedance and a real output impedance (e.g., 50 ohm impedance) coupled to an on-chip matching network 208 that transforms the input impedance of complex-input-impedance low-noise amplifier 206 into a real impedance (e.g., a 50 ohm impedance). This approach is impractical for receivers that operate at frequencies below 1 GHz. Target receive signal frequencies below approximately 1 GHz require component values (e.g., inductances and capacitances) that correspond to passive elements (e.g., inductors and/or capacitors) requiring a substantial amount of integrated circuit die area, making matching network 208 prohibitively expensive. For receivers with target frequency ranges of approximately 1 GHz to 10 GHz, matching network 208 is more practical, but still may be too expensive to be commercially viable. However, for receivers with target frequencies greater than approximately 10 GHz, matching network 208 may be feasible. Note that integrated circuit inductors typically have modest quality factors (Q) that will result in poor system noise performance even with a very low noise low-noise amplifier.

Figure 1:
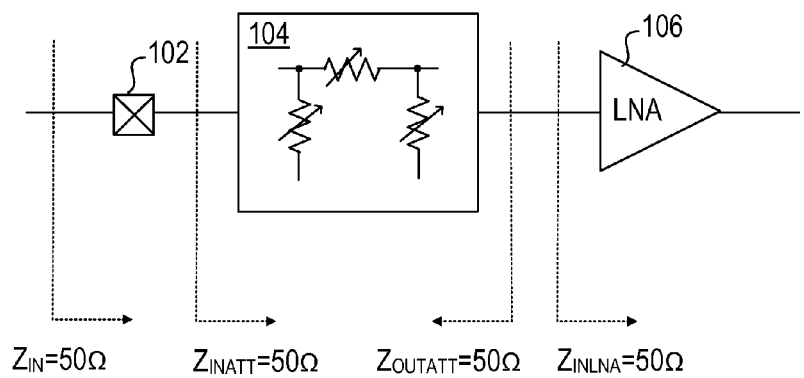
FIG. 1 illustrates a conventional receiver including a real attenuator and a real low-noise amplifier.
Figure 3:
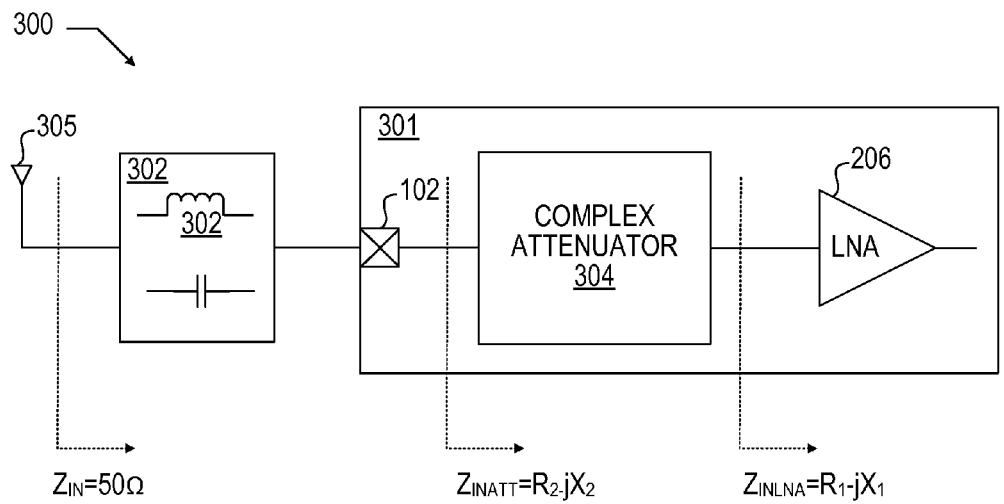
FIG. 3 illustrates a receiver including a complex attenuator consistent with at least one embodiment of the invention.
Figure 11A:
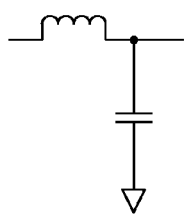
FIGS. 11A, 11B, and 11C illustrate exemplary embodiments of off-chip matching network 302.
Figure 11B:
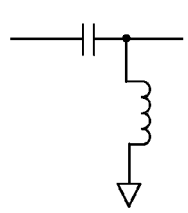
Figure 11C:
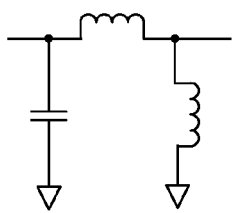

Referring to FIG. 3, system 300 includes an integrated circuit receiver 301 coupled to external matching network 302. Integrated circuit receiver 301 and external matching network 302 may be integrated on a printed circuit board or other substrate. External matching network 302 presents a load of a real resistance (e.g., 50 ohms) to antenna 305. In other embodiments of system 300, external matching network 302 is coupled to a transmission line having a real characteristic impedance rather than directly to antenna 305. External matching network 302 also presents complex attenuator 304 with a complex impedance that matches the complex input impedance of complex attenuator 304. Exemplary external matching networks are illustrated in FIGS. 11A, 11B, and 11C. However, note that other external matching networks may be used. Referring back to FIG. 3, impedance matching techniques include complex conjugate matching of the input impedance of complex attenuator 304 by use of inductors, and capacitors and may also include use of baluns or antenna tuners that are designed for particular applications. Complex attenuator 304 may be loaded with a complex impedance and has an input that presents a complex impedance. The resulting complex impedance seen looking into integrated circuit terminal 102 is the input impedance of complex attenuator 304. Since the impedance matching function occurs off-chip, large passive element values can be realized more easily and more cost effectively by using discrete devices. In addition, the corresponding passive elements are not limited by integrated circuit manufacturing techniques and may have relatively high quality factors (Q), thereby maintaining the low-noise characteristics of the low-noise amplifier and improving system performance. Integrated circuit receiver 301 includes complex attenuator 304 and complex-input-impedance low-noise amplifier 206, which provides a relatively low noise low-noise amplifier topology (e.g., an inductively-degenerated low-noise amplifier). In at least one embodiment, complex attenuator 304 achieves a wide RF attenuation range with constant impedance, without the expense of an on-chip matching network and achieves improved noise performance as compared to the systems of FIGS. 1 and 2.

Figure 4:
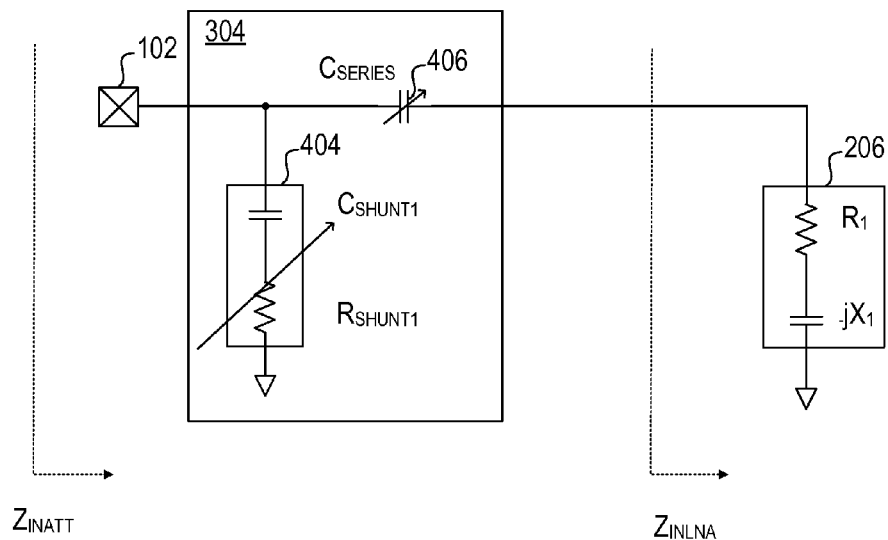
FIG. 4 illustrates a receiver including a capacitive complex attenuator consistent with at least one embodiment of the invention.

Referring to FIG. 4, in at least one embodiment, complex attenuator 304 is a capacitive attenuator. Complex attenuator 304 includes a path that is coupled in series with complex-input-impedance low-noise amplifier 206. That series path includes a selectable capacitor array ($C_{SERIES}$) that is used to adjust the attenuation of complex attenuator 304. Complex attenuator 304 includes shunt path 404 that is used to maintain a constant input impedance. To maintain a constant input impedance of complex attenuator 304, when a change is made to $C_{SERIES}$, a corresponding change is made to shunt path 404 of complex attenuator 304. Shunt path 404 includes a selectable capacitor array ($C_{SHUNT1}$). Each capacitor of the selectable capacitor array is coupled in series with a corresponding resistor. For example, when $C_{SERIES}$ is decreased to increase the attenuation, $C_{SHUNT1}$ is increased at the same time to maintain a constant $Z_{INATT}$. The selectable capacitor array of $C_{SHUNT1}$ is adjusted to compensate for less and less of the low-noise amplifier impedance being seen by integrated circuit terminal 102 as $C_{SERIES}$ decreases. When complex attenuator 304 is configured to apply no attenuation, $C_{SERIES}$ has a maximum value, $C_{SHUNT1}$ has a value of 0, $Z_{INATT}$ is approximately equal to $Z_{INLNA}$, and complex attenuator 304 passes the received signal at a nearly full power level to complex-input-impedance low-noise amplifier 206. When complex attenuator 304 applies a non-zero attenuation, $C_{SERIES}$ is decreased by $\Delta C$ from the maximum value and $C_{SHUNT1}$ is increased from zero to a corresponding value that maintains a constant $Z_{INATT}$. In general:

$$Z_{INATT} = \left( \frac{1}{j\omega C_{SHUNT1}} + R_{SHUNT1} \right) \Big\| \left( Z_{INLNA} + \frac{1}{j\omega C_{SERIES}} \right).$$

Figure 10:
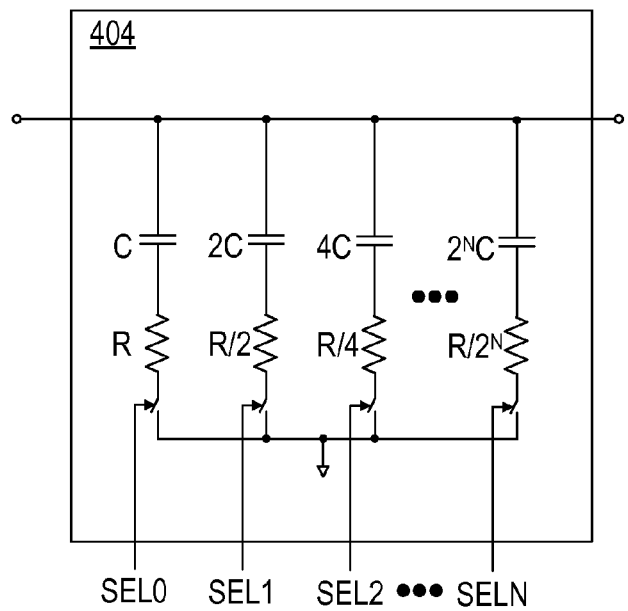
FIG. 10 illustrates an exemplary shunt circuit 404.

The resistor in shunt path 404 is used to account for the resistive component of $Z_{INLNA}$. To maintain the constant $Z_{INATT}$, a change in $C_{SHUNT1}$ is associated with a corresponding change to $C_{SERIES}$. The ratio of $C_{SHUNT1}/R_{SHUNT1}$ of shunt path 404 may be fixed or variable. This technique allows integrated circuit receiver 301 of FIG. 3 to maintain a constant, complex input impedance (i.e., $Z_{INATT}=R_2-jX_2$) while attenuating the received RF signal before low-noise amplifier 206. Referring to FIGS. 4 and 10, in at least one embodiment of the complex attenuator 304, shunt path 404 includes a binary-weighted array of selectable capacitance values configured to receive control signals (e.g., SEL0, SEL1, SEL2, . . . , SELN) from a control circuit (e.g., receiver circuit 804, described below). In other embodiments, shunt path 404 includes an array of selectable capacitors, each having the same capacitance value. Each selectable element of the capacitor array in shunt path 404 includes a capacitance and a resistance in series. Note that the configuration of elements in shunt path 404 may vary in other embodiments, e.g., capacitors, resistors, and switches of shunt path 404 may be coupled in a different order.

Figure 5:
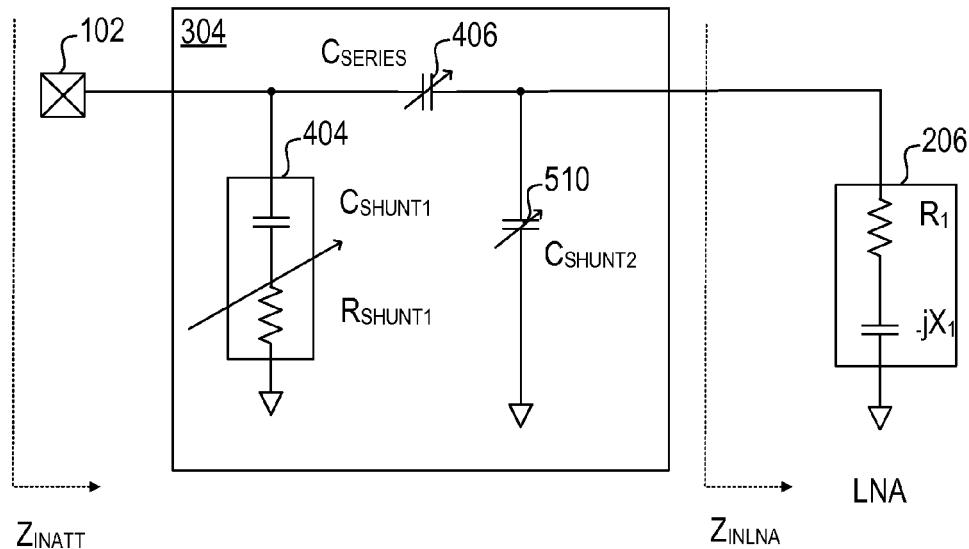
FIG. 5 illustrates a receiver including a capacitive complex attenuator with extended attenuation range consistent with at least one embodiment of the invention.

Referring to FIG. 5, in at least one embodiment, complex attenuator 304 includes shunt path 510 coupled between a reference node (e.g., a ground node) and a node between series path 406 and complex-input-impedance low-noise amplifier 206. Shunt path 510 extends the attenuation range of complex attenuator 304. Shunt path 510 includes a selectable capacitor array, $C_{SHUNT2}$. The capacitance of shunt path 404 of FIG. 5 is selected (e.g., by a control circuit) as described above with regard to FIG. 4, until $C_{SHUNT1}$ achieves a maximum value and runs out of attenuation range (i.e., achieves a maximum attenuation provided by shunt path 404 and series path 406). Then, the capacitance of $C_{SHUNT2}$ may be increased in discrete amounts to further extend the attenuation. Note that when $C_{SERIES}$ has a minimum capacitance value (as would be the case when $C_{SHUNT1}$ achieves a maximum value), $C_{SHUNT2}$ has a negligible effect on $Z_{INATT}$ so resistors may be excluded from shunt path 510 for being unnecessary to maintain a constant impedance. Although $C_{SHUNT2}$ does not substantially affect the impedance of complex attenuator 304, it does substantially extend the achievable range of attenuation.

Figure 6:
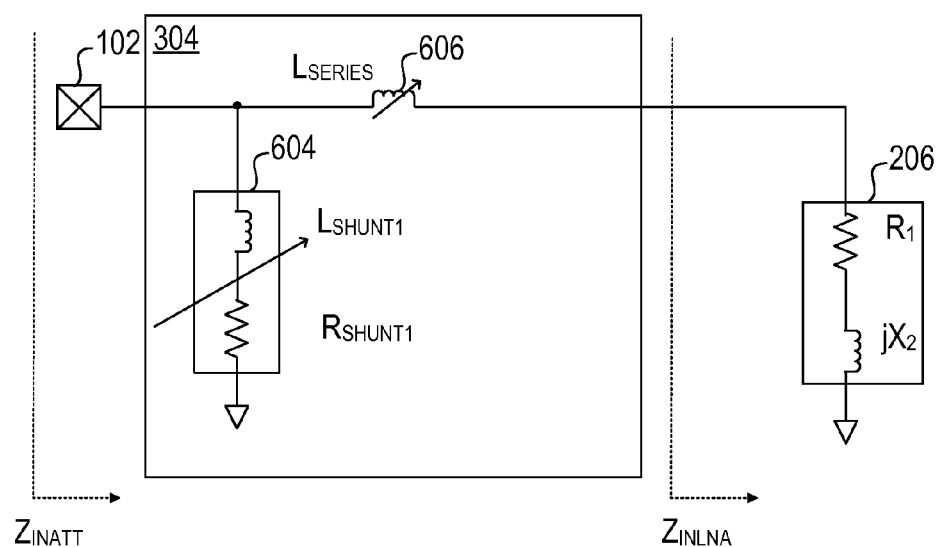
FIG. 6 illustrates a receiver including an inductive complex attenuator consistent with at least one embodiment of the invention.

FIG. 6 illustrates an inductive embodiment of complex attenuator 304. Principles and operation of the inductive embodiment are similar to those of the capacitive embodiment of FIG. 4. However, note that for the inductive embodiment, when complex attenuator applies no attenuation, $L_{SERIES}$ has a minimum value (i.e., $L_{SERIES}$ is approximately equal to zero) and $L_{SHUNT}$ has a maximum value, and the input impedance of the complex attenuator 304 approximately equals the input impedance of complex-input-impedance low-noise amplifier 206, which results in passing the received signal, substantially unattenuated, to low-noise amplifier 206. Shunt path 604 includes a switched-inductor array that includes branches of switched inductors (e.g., planar, spiral inductors) coupled in series with resistors. To maintain the constant $Z_{INATT}$, a change in $L_{SHUNT1}$ is associated with a corresponding change to $L_{SERIES}$. The inductors of the array may be binary-weighted inductances or equal-valued inductances. When complex attenuator 304 applies a non-zero attenuation, $L_{SERIES}$ is increased by $\Delta L$ and $L_{SHUNT1}$ is decreased to maintain a constant $Z_{INATT}$. Each selectable element of the inductor array in shunt path 604 includes an inductor and a resistance. An additional shunt path including another switched-inductor array may be coupled between a reference node (e.g., a ground node) and a node between series path 606 and complex-input-impedance low-noise amplifier 206 to extend the attenuation range, similar to the technique described above with regard to FIG. 5. In other embodiments of complex attenuator 304, combinations of selectable capacitances, selectable resistances, and selectable inductances are used to provide the attenuation and constant S11 two-port scattering parameter consistent with techniques described above with respect to FIGS. 4-6.

Figure 7:
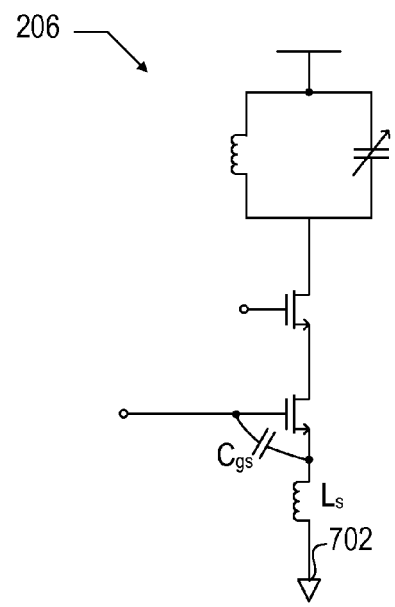
FIG. 7 illustrates an exemplary complex low-noise amplifier.
Figure 8:
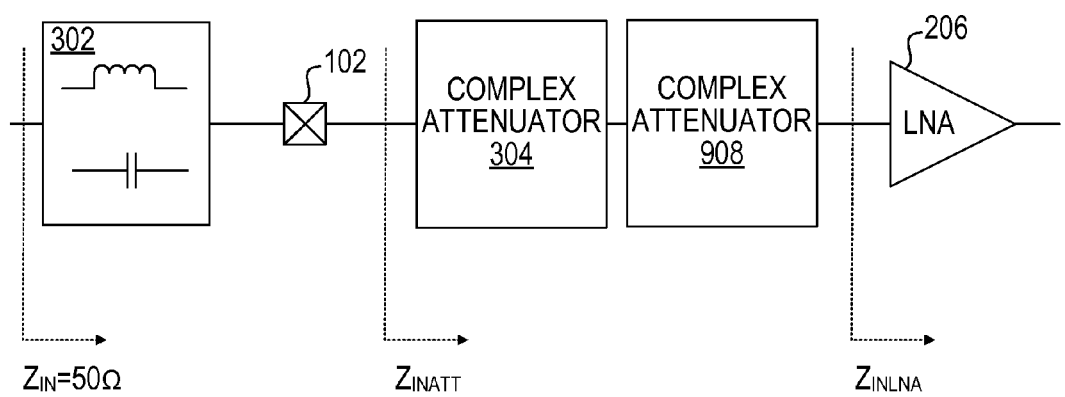
FIG. 8 illustrates a receiver including cascaded complex attenuators consistent with at least one embodiment of the invention.

FIG. 7 illustrates a circuit diagram of an exemplary complex-input-impedance low-noise amplifier that may be included in integrated circuit receiver 301. Complex-input-impedance low-noise amplifier 206 is an inductively-degenerated low-noise amplifier. Note that the techniques described herein are applicable to other inductively-degenerated low-noise amplifier topologies and other low-noise amplifiers having complex input impedances. Referring to FIGS. 3 and 7, in at least one embodiment of receiver 300, ground node 702 of low-noise amplifier 206 is directly coupled to the ground node of complex attenuator 304. Coupling the low-noise amplifier and the attenuator to the same ground node reduces or eliminates effects of parasitic impedances due to bond wires, packaging, etc., on the effective value of $Z_{INATT}$. Referring to FIG. 8, in at least one embodiment of an RF receiver integrated circuit, multiple complex attenuators are coupled in series with complex input impedance low-noise amplifier 206. Complex attenuator 304 and complex attenuator 908 may be identical circuits or may provide different impedance values and may have the same or different attenuation ranges. In other embodiments of low-noise amplifier 206, a differential version of low-noise amplifier 206 of FIG. 7 or other differential amplifier is used and complex attenuator 304 is a differential circuit or multiple complex attenuators 304 are used to provide a differential signal to the differential, low-noise amplifier.

Figure 9:
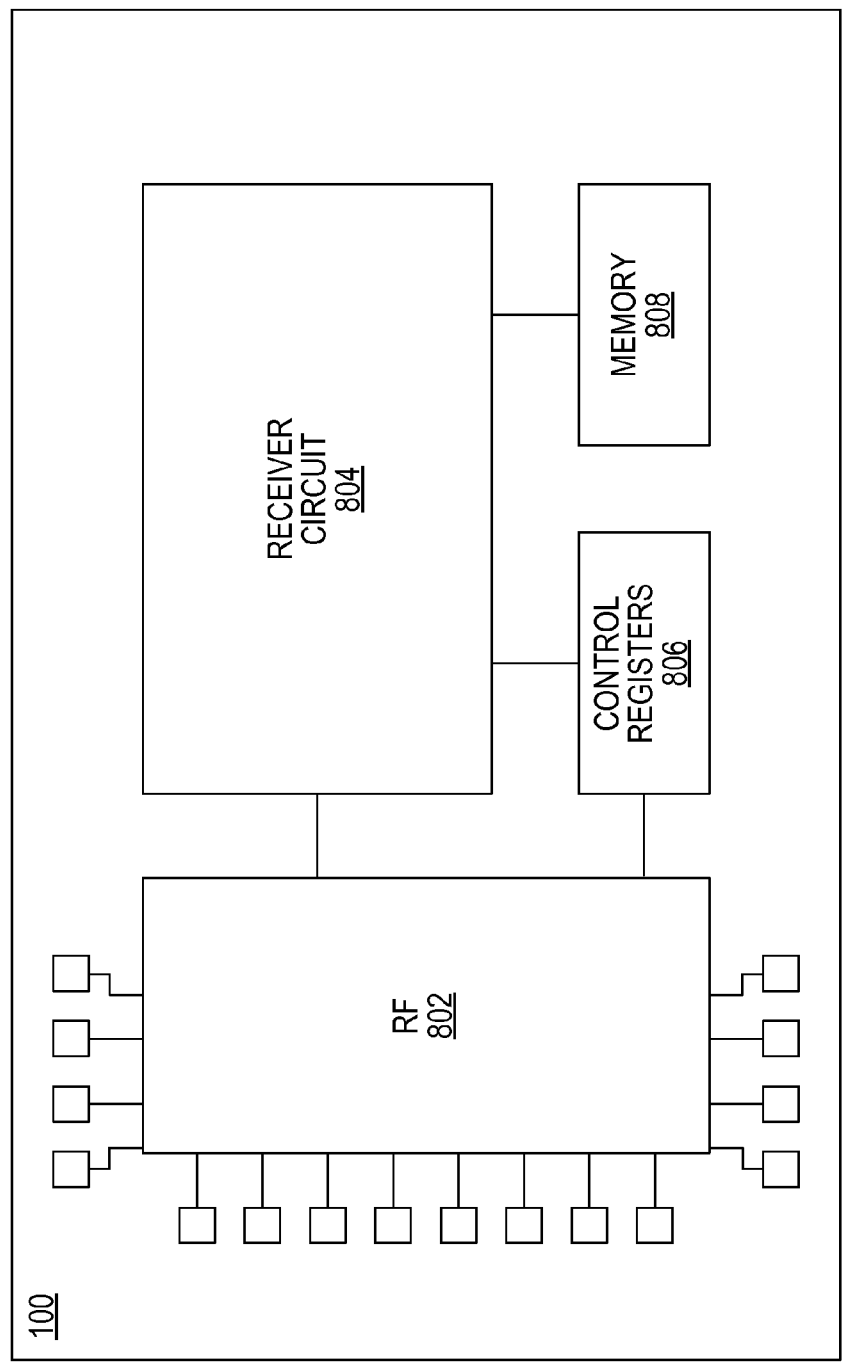
FIG. 9 illustrates an exemplary integrated circuit receiver system consistent with at least one embodiment of the invention.

Referring to FIG. 9, in at least one embodiment of an RF receiver integrated circuit, the RF receiver is included in a system that converts the output of the low-noise amplifier to a digital signal for further processing. RF circuit 802 includes a complex attenuator and a low-noise amplifier consistent with the description above. RF circuit 802 provides the output of the low-noise amplifier to receiver circuit 804, which may include a mixer and other circuitry that perform frequency conversion to an intermediate frequency, convert the intermediate frequency signal to a digital signal, and demodulate digital data. In other embodiments, receiver circuit 804 excludes an analog-to-digital converter and performs demodulation and signal processing of the intermediate frequency signal. Receiver circuit 804 may be an application-specific circuit or a general purpose processor configured to execute instructions stored in memory 808. In addition, receiver circuit 804 may receive data provided by RF circuit 802 and use these data to generate automatic gain control settings. Those automatic gain control settings may be used to set the attenuation of complex attenuator 304 (e.g., by providing control signals that selectively enable values of $C_{SERIES}$ and $C_{SHUNT1}$ and/or $C_{SHUNT2}$ of FIGS. 4, 5, and 10) and/or stored in memory 808 and/or control registers 806 of FIG. 9 for further use. In at least one embodiment, during an initialization or calibration sequence, receiver circuit 804 configures complex attenuator 304 for no attenuation and incrementally increases the attenuation to achieve a target receive signal level for steady-state operations. The attenuation of complex attenuator 304 may be adjusted dynamically during steady-state operations according to signal conditions. The attenuation level may be adjusted to a value determined by receiver circuit 804 based on any suitable specifications.

The description of the invention set forth herein is illustrative, and is not intended to limit the scope of the invention as set forth in the following claims. For example, while the invention has been described in embodiments coupled to an antenna having a particular real impedance (e.g., 50 ohms), one of skill in the art will appreciate that the teachings herein can be utilized in embodiments coupled to transmission lines (e.g., wires, coaxial cables) or other antennas, which may have other real impedance values (e.g., 75 ohms). Variations and modifications of the embodiments disclosed herein may be made based on the description set forth herein, without departing from the scope and spirit of the invention as set forth in the following claims.

What is claimed is:

1. An apparatus comprising:
 an integrated circuit comprising:
  a low-noise amplifier having a first complex input impedance; and
  a complex attenuator coupled to an input terminal of the integrated circuit, the complex attenuator having a second complex input impedance and a first complex output impedance, the complex attenuator comprising:
   a selectable series impedance circuit having a first selectable impedance coupled between the input terminal of the integrated circuit and an input of the low-noise amplifier; and
   a first shunt circuit having a second selectable impedance, the first shunt circuit being coupled between the input terminal of the integrated circuit and a first reference node.

2. The apparatus, as recited in claim 1, further comprising:
 a matching network coupled to the input terminal of the integrated circuit, the matching network being external to the integrated circuit and having a first real input impedance and a second complex output impedance, the second complex output impedance being matched to the second complex input impedance.

3. The apparatus, as recited in claim 1, wherein the first selectable impedance is a selectable capacitance and the first shunt circuit includes a plurality of circuits selectably coupled in parallel, each circuit of the plurality of circuits including a resistor and a capacitor coupled in series.

4. The apparatus, as recited in claim 1, wherein the first selectable impedance is a selectable inductance and the first shunt circuit includes a plurality of circuits selectably coupled in parallel, each circuit of the plurality of circuits including a resistor and an inductor coupled in series.

5. The apparatus, as recited in claim 1, wherein the complex attenuator comprises:
 a second shunt circuit having a third selectable impedance coupled between the input of the low-noise amplifier and the first reference node.

6. The apparatus, as recited in claim 5, wherein the third selectable impedance is a selectable capacitance.

7. The apparatus, as recited in claim 1, wherein the first reference node is coupled to a second reference node of the low-noise amplifier, the first reference node and the second reference node being coupled to a ground node.

8. The apparatus, as recited in claim 1, wherein the integrated circuit further comprises:
 a circuit configured to adjust an attenuation of the complex attenuator in response to a signal received from the low-noise amplifier.

9. The apparatus, as recited in claim 1, wherein the complex attenuator is configured to maintain a constant input port reflection coefficient.

10. The apparatus, as recited in claim 1, further comprising:
 a second complex attenuator coupled to an output of the complex attenuator, the second complex attenuator having a third complex input impedance and a second complex output impedance.

11. The apparatus, as recited in claim 1, wherein the first selectable impedance is a selectable inductance and the first shunt circuit includes a plurality of circuits selectably coupled in parallel, each circuit of the plurality of circuits including a resistor and an inductor coupled in series.

12. An apparatus comprising:
 an integrated circuit comprising:
  a low-noise amplifier having a first complex input impedance, the low-noise amplifier including an inductor, the first complex input impedance being based on an inductance of the inductor; and
  a complex attenuator coupled to an input terminal of the integrated circuit, the complex attenuator having a second complex input impedance and a first complex output impedance.

13. The apparatus, as recited in claim 12, wherein the complex attenuator comprises:
 a selectable series impedance circuit having a first selectable impedance coupled between the input terminal of the integrated circuit and an input of the low-noise amplifier; and
 a first shunt circuit having a second selectable impedance, the first shunt circuit being coupled between the input terminal of the integrated circuit and a first reference node.

14. The apparatus, as recited in claim 12, wherein the complex attenuator comprises:
 a shunt impedance circuit having a selectable impedance coupled between an input of the low-noise amplifier and a first reference node.

15. The apparatus, as recited in claim 12, wherein the integrated circuit further comprises:
 a circuit configured to adjust an attenuation of the complex attenuator in response to a signal received from the low-noise amplifier.

16. A method comprising:
 receiving a radio frequency signal by an attenuator presenting a complex impedance at an input terminal of an integrated circuit;
 providing an attenuated received signal to an amplifier, the attenuated received signal being generated by the attenuator, the attenuator being configured to maintain a complex input impedance at the input terminal of the integrated circuit; and
 changing an attenuation of the attenuator while maintaining the complex input impedance at the input terminal of the integrated circuit, the changing the attenuation comprising adjusting a series capacitance and a shunt capacitance to maintain a constant, complex impedance at the input terminal of the integrated circuit.

17. The method, as recited in claim 16, further comprising:
 generating the attenuated received signal by applying a predetermined attenuation to the received signal.

18. The method, as recited in claim 17, wherein the predetermined attenuation is a capacitive attenuation.

19. The method, as recited in claim 17, wherein the predetermined attenuation is an inductive attenuation.

20. The method, as recited in claim 16, wherein an input port reflection coefficient of the attenuator is constant.

21. The method, as recited in claim 16, wherein the attenuation is changed in response to a magnitude of an input signal received using the input terminal of the integrated circuit.

22. The method, as recited in claim 16, further comprising:
 extending a range of the attenuation using an additional shunt capacitance.

* * * * *